(12) United States Patent
Kajiwara et al.

(10) Patent No.: US 12,349,386 B2
(45) Date of Patent: Jul. 1, 2025

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Yosuke Kajiwara, Yokohama (JP); Hiroshi Ono, Setagaya (JP); Daimotsu Kato, Kawasaki (JP); Akira Mukai, Kawasaki (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 779 days.

(21) Appl. No.: 17/398,546

(22) Filed: Aug. 10, 2021

(65) Prior Publication Data

US 2022/0231155 A1 Jul. 21, 2022

(30) Foreign Application Priority Data

Jan. 20, 2021 (JP) .................................. 2021-006881
Jul. 13, 2021 (JP) .................................. 2021-115503

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/824* (2025.01); *H10D 62/8503* (2025.01); *H10D 64/118* (2025.01)

(58) Field of Classification Search
None
See application file for complete search history.

(56) References Cited

U.S. PATENT DOCUMENTS 9,142,636 B2   9/2015   Sheppard et al.
9,306,027 B2   4/2016   Inoue et al.
(Continued)

FOREIGN PATENT DOCUMENTS

CN      103930978 A    7/2014
JP      2010-118556 A  5/2010
(Continued)

OTHER PUBLICATIONS

Chinese Office Action dated Mar. 20, 2025, issued in Chinese Patent Application No. 202110946289.6 (with English translation; documents 15-17 being cited therein).
(Continued)

*Primary Examiner* — Grant S Withers
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor regions, first and second insulating members. The third electrode includes a first electrode portion. The first electrode portion is between the first electrode and the second electrode. The first semiconductor region includes first to fifth partial regions. The fourth partial region is between the first and third partial regions. The fifth partial region is between the third and second partial regions. The second semiconductor region includes first and second semiconductor portions. The first insulating member includes a first insulating portion. The first insulating portion is between the third and first electrode portions. The second insulating member includes first and second insulating regions. The first insulating region is between the first electrode and the first electrode portion. The second insulating region is between the first insulating region and the first electrode portion.

18 Claims, 11 Drawing Sheets

(51) Int. Cl.
*H10D 62/824* (2025.01)
*H10D 62/85* (2025.01)
*H10D 64/00* (2025.01)

(56) References Cited

U.S. PATENT DOCUMENTS

| | | | |
|---|---|---|---|
| 9,559,183 | B2 | 1/2017 | Inoue et al. |
| 10,256,100 | B2 | 4/2019 | Hirai et al. |
| 2014/0284613 | A1 | 9/2014 | Kuraguchi et al. |
| 2017/0141208 | A1* | 5/2017 | Iucolano ............... H01L 29/205 |
| 2019/0371927 | A1* | 12/2019 | Kajiwara ............ H01L 29/4236 |
| 2020/0295169 | A1 | 9/2020 | Kato et al. |
| 2020/0411675 | A1* | 12/2020 | Kato ..................... H01L 29/513 |
| 2021/0043750 | A1 | 2/2021 | Neufeld et al. |

FOREIGN PATENT DOCUMENTS

| | | |
|---|---|---|
| JP | 2011-529639 A | 12/2011 |
| JP | 2014-003301 A | 1/2014 |
| JP | 2014-022742 A | 2/2014 |
| JP | 2014-45174 A | 3/2014 |
| JP | 2014-187084 A | 10/2014 |
| JP | 2015-103780 A | 6/2015 |
| JP | 2016-86125 A | 5/2016 |
| JP | 2017-195400 A | 10/2017 |
| JP | 6240460 B2 | 11/2017 |
| JP | 2019-009462 A | 1/2019 |
| JP | 2019-505992 A | 2/2019 |
| JP | 6468886 B2 | 2/2019 |
| JP | 2019-218275 A | 12/2019 |
| JP | 2020-150141 A | 9/2020 |
| JP | 8793887 81 | 12/2020 |

OTHER PUBLICATIONS

Japanese Office Action dated April 1. 2025. Issued in Japanese Patent Application No. 2024-109332 (with English translation; documents 18-19 being cited therein).

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2021-006881, filed on Jan. 20, 2021, and Japanese Patent Application No. 2021-115503, filed on Jul. 13, 2021; the entire contents of which are incorporated herein by reference.

FIELD

Embodiments described herein relate generally to a semiconductor device and a method for manufacturing the same.

BACKGROUND

For example, characteristics are desired to be improved for a semiconductor device such as a transistor.

DETAILED DESCRIPTION

Figure 1:
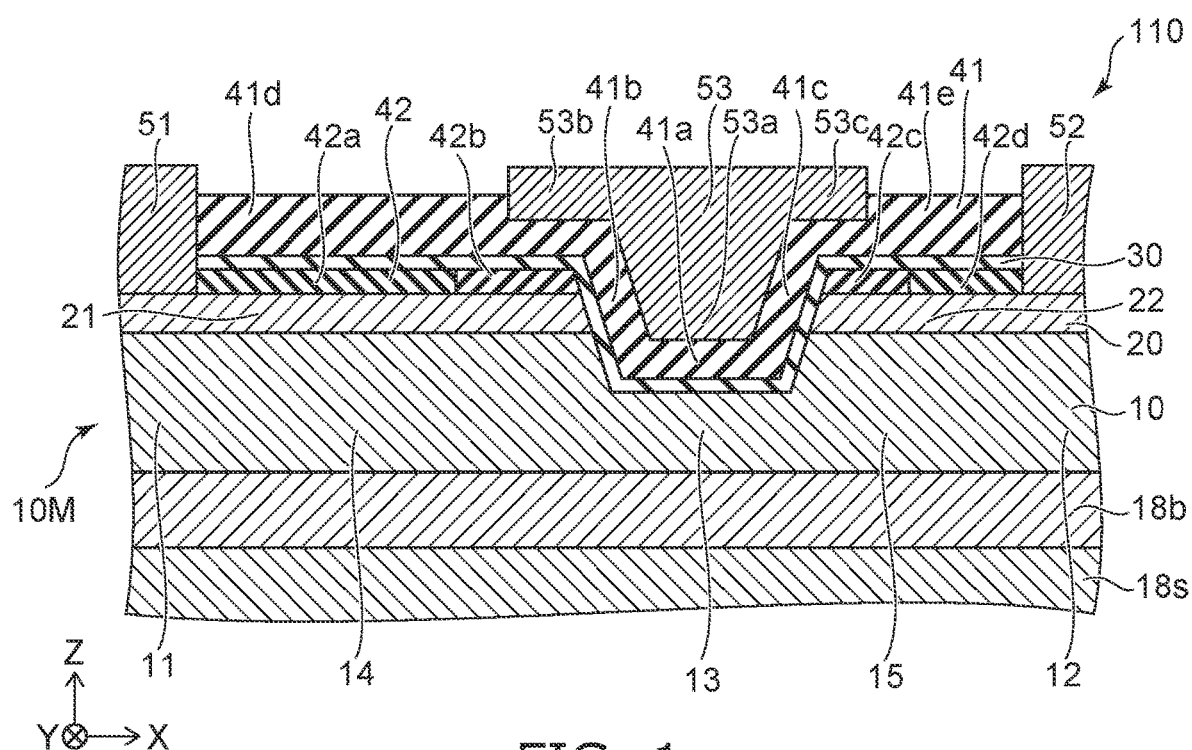
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a first insulating member, and a second insulating member. A direction from the first electrode toward the second electrode is along a first direction. The third electrode includes a first electrode portion. A position of the first electrode portion in the first direction is between a position of the first electrode in the first direction and a position of the second electrode in the first direction. The first semiconductor region includes $Al_{x1}Ga_{1-x1}N$ (0≤x1<1). The first semiconductor region includes a first partial region, a second partial region, a third partial region, a fourth partial region, and a fifth partial region. A direction from the first partial region toward the first electrode is along a second direction crossing the first direction. A direction from the second partial region toward the second electrode is along the second direction. A direction from the third partial region toward the first electrode portion is along the second direction. The fourth partial region is between the first partial region and the third partial region in the first direction. The fifth partial region is between the third partial region and the second partial region in the first direction. The second semiconductor region includes $Al_{x2}Ga_{1-x2}N$ (x1<x2≤1). The second semiconductor region includes a first semiconductor portion and a second semiconductor portion. A direction from the fourth partial region toward the first semiconductor portion is along the second direction. A direction from the fifth partial region toward the second semiconductor portion is along the second direction. The first insulating member includes at least one of silicon or aluminum, and oxygen. The first insulating member includes a first insulating portion. The first insulating portion is between the third partial region and the first electrode portion. The second insulating member includes silicon and nitrogen. The second insulating member includes a first insulating region and a second insulating region. A position of the first insulating region in the first direction is between the position of the first electrode in the first direction and the position of the first electrode portion in the first direction. A position of the second insulating region in the first direction is between the position of the first insulating region in the first direction and the position of the first electrode portion in the first direction. The first semiconductor portion is between the fourth partial region and the first insulating region, and between the fourth partial region and the second insulating region. The second insulating region has at least one of a second nitrogen concentration higher than a first nitrogen concentration in the first insulating region, a second hydrogen concentration lower than a first hydrogen concentration in the first insulating region, or a second density higher than a first density in the first insulating region.

According to one embodiment, a semiconductor device includes a first electrode, a second electrode, a third electrode, a first semiconductor region, a second semiconductor region, a first insulating member, and a second insulating member. A direction from the first electrode toward the second electrode is along a first direction. The third electrode includes a first electrode portion. A position of the first electrode portion in the first direction is between a position of the first electrode in the first direction and a position of the second electrode in the first direction. The first semiconductor region includes $Al_{x1}Ga_{1-x1}N$ (0≤x1<1). The first semiconductor region includes a first partial region, a second partial region, a third partial region, a fourth partial region, and a fifth partial region. A direction from the first partial region toward the first electrode is along a second direction crossing the first direction. A direction from the second partial region toward the second electrode is along the second direction. A direction from the third partial region toward the first electrode portion is along the second direction. The fourth partial region is between the first partial region and the third partial region in the first direction. The fifth partial region is between the third partial region and the second partial region in the first direction. The second semiconductor region includes $Al_{x2}Ga_{1-x2}N$ (x1<x2≤1). The second semiconductor region includes a first semiconductor portion and a second semiconductor portion. A direction from the fourth partial region toward the first semiconductor portion is along the second direction. A direction from the fifth partial region toward the second semiconductor portion is along the second direction. The first insulating member includes at least one of silicon or aluminum, and oxygen.

The first insulating member includes a first insulating portion. The first insulating portion is between the third partial region and the first electrode portion. The second insulating member includes silicon and nitrogen. The second insulating member includes a first insulating region and a second insulating region. A position of the first insulating region in the first direction is between the position of the first electrode in the first direction and the position of the first electrode portion in the first direction. A position of the second insulating region in the first direction is between the position of the first insulating region in the first direction and the position of the first electrode portion in the first direction. The first semiconductor portion is between the fourth partial region and the first insulating region, and between the fourth partial region and the second insulating region. A second thickness of the second insulating region along the second direction is thinner than a first thickness of the first insulating region along the second direction.

According to one embodiment, a method for manufacturing a semiconductor device is disclosed. The method can include forming a first insulating film including silicon and nitrogen on a portion of a second semiconductor region of a semiconductor member. The semiconductor member includes a first semiconductor region including $Al_{x1}Ga_{1-x1}N$ ($0 \leq x1 < 1$) and a second semiconductor region including $Al_{x2}Ga_{1-x2}N$ ($x1 < x2 \leq 1$). The method can include forming a second insulating film including silicon and nitrogen on an other portion of the second semiconductor region. The method can include removing a portion of the second insulating film, and forming a hole in the semiconductor member exposed by the removing the portion of the second insulting film. The method can include forming a first insulating member including silicon and oxygen in the hole. The method can include forming a third electrode in a remaining space of the hole, and forming a first electrode and a second electrode. The first insulating film and the second insulating film are between the first electrode and the second electrode, and between the second electrode and the third electrode. The second insulating film has at least one of a second nitrogen concentration higher than a first nitrogen concentration in the first insulating film, a second hydrogen concentration lower than a first hydrogen concentration in the first insulating film, or a second density higher than a first density in the first insulating film.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first semiconductor region 10, a second semiconductor region 20, a first insulating member 41, and a second insulating member 42.

The direction from the first electrode 51 toward the second electrode 52 is along a first direction. The first direction is taken as an X-axis direction. One direction perpendicular to the X-axis direction is taken as a Z-axis direction. The direction perpendicular to the X-axis direction and the Z-axis direction is taken as a Y-axis direction.

The third electrode 53 includes a first electrode portion 53a. The position of the first electrode portion 53a in the first direction (X-axis direction) is between the position of the first electrode 51 in the first direction and the position of the second electrode 52 in the first direction.

The first semiconductor region 10 includes $Al_{x1}Ga_{1-x1}N$ ($0 \leq x1 < 1$). The composition ratio x1 is, for example, not less than 0 and less than 0.1. The first semiconductor region 10 includes, for example, GaN.

The first semiconductor region 10 includes a first partial region 11, a second partial region 12, a third partial region 13, a fourth partial region 14, and a fifth partial region 15. The direction from the first partial region 11 toward the first electrode 51 is along a second direction crossing the first direction. The second direction is, for example, the Z-axis direction. The direction from the second partial region 12 toward the second electrode 52 is along the second direction. The direction from the third partial region 13 toward the first electrode portion 53a is along the second direction. The fourth partial region 14 is between the first partial region 11 and the third partial region 13 in the first direction (X-axis direction). The fifth partial region 15 is between the third partial region 13 and the second partial region 12 in the first direction.

The second semiconductor region 20 includes $Al_{x2}Ga_{1-x2}N$ ($x1 < x2 \leq 1$). The composition ratio x2 is, for example, not less than 0.1 and 0.35 or less. The second semiconductor region 20 is, for example, AlGaN. A region including AlN may be provided between the first semiconductor region 10 and the second semiconductor region 20. The thickness of the region containing AlN (length in the Z-axis direction) is, for example, not more than 1.5 nm.

The second semiconductor region 20 includes a first semiconductor portion 21 and a second semiconductor portion 22. The direction from the fourth partial region 14 toward the first semiconductor portion 21 is along the second direction (for example, the Z-axis direction). The direction from the fifth partial region 15 toward the second semiconductor portion 22 is along the second direction.

In this example, the semiconductor device 110 includes a substrate body 18s and a nitride layer 18b. The substrate body 18s may be, for example, a substrate. The substrate body 18s may be, for example, a silicon substrate. A nitride layer 18b is provided on the substrate body 18s. The first semiconductor region 10 is provided on the nitride layer 18b. The second semiconductor region 20 is provided on the first semiconductor region 10. The nitride layer 18b is, for example, a buffer layer. The nitride layer 18b includes Al, Ga and nitrogen. The first semiconductor region 10 and the second semiconductor region 20 are included in, for example, a semiconductor member 10M.

The first insulating member 41 includes at least one of silicon or aluminum, and oxygen. The first insulating member includes, for example, $SiO_2$, $Al_2O_3$, or AlSiO. The first insulating member 41 may include nitrogen. The first insulating member 41 may include AlON or SiON. A thickness of the first insulating member 41 is, for example, not less than 20 nm and not more than 150 nm. By such thickness, a high breakdown voltage and low channel resistance can be obtained.

The first insulating member 41 includes a first insulating portion 41a. The first insulating portion 41a is between the third partial region 13 and the first electrode portion 53a.

The second insulating member 42 includes silicon and nitrogen. A concentration of nitrogen in the second insulating member 42 is higher than a concentration of nitrogen in the first insulating member 41. A concentration of oxygen in the first insulating member 41 is higher than a concentration of oxygen in the second insulating member 42.

The second insulating member 42 includes a first insulating region 42a and a second insulating region 42b. The position of the first insulating region 42a in the first direction (X-axis direction) is between the position of the first electrode 51 in the first direction and the position of the first electrode portion 53a in the first direction. The position of the second insulating region 42b in the first direction is between the position of the first insulating region 42a in the first direction and the position of the first electrode portion 53a in the first direction. The first semiconductor portion 21 is between the fourth partial region 14 and the first insulating region 42a, and between the fourth partial region 14 and the second insulating region 42b.

For example, a distance between the first electrode 51 and the first electrode portion 53a is longer than a distance between the first electrode portion 53a and the second electrode 52.

The first electrode 51 is electrically connected to, for example, at least one of the first partial region 11 or the first semiconductor portion 21. The second electrode 52 is electrically connected to, for example, at least one of the second partial region 12 or the second semiconductor portion 22.

A current flowing between the first electrode 51 and the second electrode 52 can be controlled by a potential of the third electrode 53. The potential of the third electrode 53 is, for example, a potential based on a potential of the second electrode 52. The first electrode 51 is, for example, a drain electrode. The second electrode 52 is, for example, a source electrode. The third electrode 53 is, for example, a gate electrode. The first insulating portion 41a functions as, for example, a gate insulating film.

For example, the semiconductor device 110 is a transistor. A carrier region (for example, a two-dimensional electron gas) is formed in a portion of the first semiconductor region 10 facing the second semiconductor region 20. The semiconductor device 110 is, for example, HEMT (High Electron Mobility Transistor).

In the embodiment, for example, a material of the second insulating region 42b is different from a material of the first insulating region 42a. In the embodiment, the second insulating region 42b has at least one of a second nitrogen concentration higher than a first nitrogen concentration in the first insulating region 42a, a second hydrogen concentration lower than a first hydrogen concentration in the first insulating region 42a, or a second density higher than a first density in the first insulating region 42a. With such a second insulating member 42, for example, fluctuations in the threshold voltage can be suppressed. The threshold voltage can be stabilized. For example, current collapse can be suppressed. For example, a high breakdown voltage can be obtained.

For example, the second nitrogen concentration in the second insulating region 42b near the third electrode 53 is higher than the first nitrogen concentration in the first insulating region 42a. As a result, a high breakdown voltage can be easily obtained. For example, the second hydrogen concentration in the second insulating region 42b near the third electrode 53 is lower than the first hydrogen concentration in the first insulating region 42a. As a result, a high breakdown voltage can be easily obtained. For example, the second density in the second insulating region 42b near the third electrode 53 is higher than the first density in the first insulating region 42a. As a result, a high breakdown voltage can be easily obtained. According to the embodiment, it is possible to provide a semiconductor device whose characteristics can be improved.

For example, the first nitrogen concentration in the first insulating region 42a near the first electrode 51 is lower than the second nitrogen concentration in the second insulating region 42b. As a result, the current collapse is easily suppressed. For example, the first hydrogen concentration in the first insulating region 42a near the first electrode 51 is higher than the second hydrogen concentration in the second insulating region 42b. As a result, the current collapse is easily suppressed. For example, the first density in the first insulating region 42a near the first electrode 51 is lower than the second density in the second insulating region 42b. As a result, the current collapse is easily suppressed. According to the embodiment, it is possible to provide a semiconductor device whose characteristics can be improved.

For example, a ratio of a silicon concentration to the nitrogen concentration in the second insulating region 42b is lower than 0.75. The second insulating region 42b is, for example, a nitrogen-rich silicon nitride.

For example, a ratio of a silicon concentration to the nitrogen concentration in the first insulating region 42a is higher than 0.75. The first insulating region 42a is, for example, a silicon-rich silicon nitride.

In one example, such a second insulating member 42 can be obtained by separately forming a film that becomes the first insulating region 42a and a film that becomes the second insulating region 42b when the second insulating member 42 is formed.

In the embodiment, the boundary between the first insulating region 42a and the second insulating region 42b may be clear or unclear. As will be described later, a region having intermediate characteristics may be provided between these insulating regions.

As shown in FIG. 1, the second insulating member 42 may include a third insulating region 42c and a fourth insulating region 42d. The position of the third insulating region 42c in the first direction (X-axis direction) is between the position of the first electrode portion 53a in the first direction and the position of the second electrode 52 in the first direction. The position of the fourth insulating region 42d in the first direction is between the position of the third insulating region 42c in the first direction and the position of the second electrode 52 in the first direction. The second semiconductor portion 22 is between the fifth partial region 15 and the third insulating region 42c, and between the fifth partial region 15 and the fourth insulating region 42d.

The third insulating region 42c has at least one of a third nitrogen concentration higher than a fourth nitrogen concentration in the fourth insulating region 42d, a third hydrogen concentration lower than a fourth hydrogen concentration in the fourth insulating region 42d, or a third density higher than a fourth density in a fourth insulating region 42d. With such a third insulating region 42c, it is easy to obtain a high breakdown voltage. For example, a gate leak current can be reduced.

For example, a material of the third insulating region 42c may be substantially the same as the material of the second insulating region 42b. A material of the fourth insulating region 42d may be substantially the same as the material of the first insulating region 42a.

For example, a ratio of a silicon concentration to the nitrogen concentration in the third insulating region 42c is lower than 0.75. For example, a ratio of the silicon concentration to the nitrogen concentration in the fourth insulating region 42d is higher than 0.75.

As shown in FIG. 1, in this example, at least a portion of the first electrode portion 53a is between the first semiconductor portion 21 and the second semiconductor portion 22 in the first direction (X-axis direction). For example, at least a portion of the first electrode portion 53a is between the fourth partial region 14 and the fifth partial region 15 in the first direction. The third electrode 53 is, for example, a trench type gate electrode. For example, it is easy to obtain a high threshold voltage. For example, normal off characteristics can be obtained.

In this example, the third electrode 53 further includes a second electrode portion 53b. A portion of the first semiconductor portion 21 is between the fourth partial region 14 and the second electrode portion 53b. The second electrode portion 53b is, for example, an eaves portion. At least a portion of the second insulating region 42b is between a portion of the first semiconductor portion 21 and the second electrode portion 53b.

In this example, the third electrode 53 further includes a third electrode portion 53c. A portion of the second semiconductor portion 22 is between the fifth partial region 15 and the third electrode portion 53c. The third electrode portion 53c is, for example, an eaves portion. At least a portion of the third insulating region 42c is between a portion of the second semiconductor portion 22 and the third electrode portion 53c.

By providing the second electrode portion 53b and the third electrode portion 53c, for example, a low electrical resistance can be obtained in the third electrode portion 53. When such an eaves portion is provided, by providing the second insulating region 42a and the third insulating region 42c as described above, it is easy to obtain a high breakdown voltage and a stable threshold voltage.

As shown in FIG. 1, the first insulating member 41 includes a second insulating portion 41b and a third insulating portion 41c. The second insulating portion 41b is between the first semiconductor portion 21 and the first electrode portion 53a. The third insulating portion 41c is between the first electrode portion 53a and the second semiconductor portion 22.

As shown in FIG. 1, the first insulating member 41 may include a fourth insulating portion 41d and a fifth insulating portion 41e. For example, the first insulating region 42a is between the first semiconductor portion 21 and the fourth insulating portion 41d. The fourth insulating region 42d is between the second semiconductor portion 22 and the fifth insulating portion 41e.

As shown in FIG. 1, in this example, the semiconductor device 110 further includes a nitride member 30. The nitride member 30 includes $Al_{x3}Ga_{1-x3}N$ (x2<x3≤1). The composition ratio x3 is, for example, not less than 0.8 and not more than 1. The nitride member 30 is, for example, AlN. At least a portion of the nitride member 30 is between the third partial region 13 and the first insulating portion 41a. By providing the nitride member 30, a higher electron mobility can be obtained. For example, a lower on-resistance is obtained. A thickness of the nitride member 30 is, for example, not less than 1.5 nm and not more than 10 nm. High channel mobility can be obtained when the thickness of the nitride member 30 is not less than 1.5 nm. The nitride member 30 can be stable and a gate leak current can be suppressed when the thickness of the nitride member 30 is not more than 10 nm.

A portion of the nitride member 30 may be provided, for example, between the fourth partial region 14 and the first electrode portion 53a. A portion of the nitride member 30 may be provided, for example, between the first electrode portion 53a and the fifth partial region 15. A portion of the nitride member 30 may be provided, for example, between the first semiconductor portion 21 and the first electrode portion 53a. A portion of the nitride member 30 may be provided, for example, between the second electrode portion 53a and the second semiconductor portion 22.

For example, the first insulating region 42a may be provided between the first semiconductor portion 21 and a portion of the nitride member 30. The second insulating region 42b may be provided between the first semiconductor portion 21 and a portion of the nitride member 30. The third insulating region 42c may be provided between the second semiconductor portion 22 and a portion of the nitride member 30. The fourth insulating region 42d may be provided between the second semiconductor portion 22 and a portion of the nitride member 30.

Figure 2:
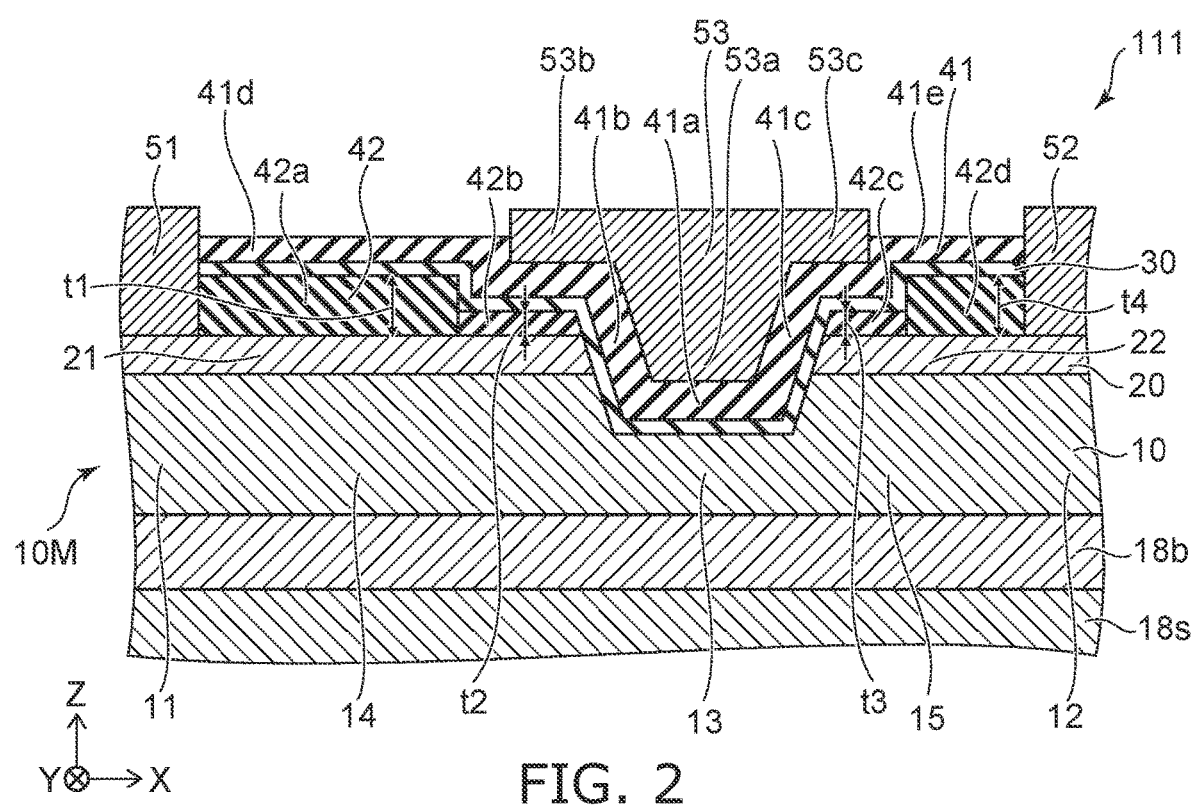
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, a semiconductor device 111 according to the embodiment also includes the first electrode 51, the second electrode 52, the third electrode 53, the first semiconductor region 10, the second semiconductor region 20, the first insulating member 41, and the second insulating member 42. In the semiconductor device 111, a thickness of the first insulating region 42a is different from a thickness of the second insulating region 42b, and a thickness of the fourth insulating region 42d is different from a thickness of the third insulating region 42c. Other configurations in the semiconductor device 111 may be the same as those in the semiconductor device 110.

As shown in FIG. 1, the thickness of the first insulating region 42a along the second direction (Z-axis direction) is taken as a first thickness t1. The thickness of the second insulating region 42b along the second direction is taken as a second thickness t2. The thickness of the third insulating region 42c along the second direction is taken as a third thickness t3. The thickness of the fourth insulating region 42d along the second direction is taken as a fourth thickness t4. In this example, the second thickness t2 is thinner than the first thickness t1. The third thickness t3 is thinner than the fourth thickness t4. The third thickness t3 may be substantially the same as the second thickness t2. The fourth thickness t4 may be substantially the same as the first thickness t1.

Since the second thickness t2 is thin, the fluctuation of the threshold voltage can be further suppressed. Since the third thickness t3 is thin, the fluctuation of the threshold voltage can be further suppressed.

For example, the second thickness t2 is not more than 5 nm. For example, a ratio of the second thickness t2 to the first thickness t1 is not more than 0.5. For example, the first thickness t1 is more than 5 nm and not more than 150 nm.

Figure 3A:
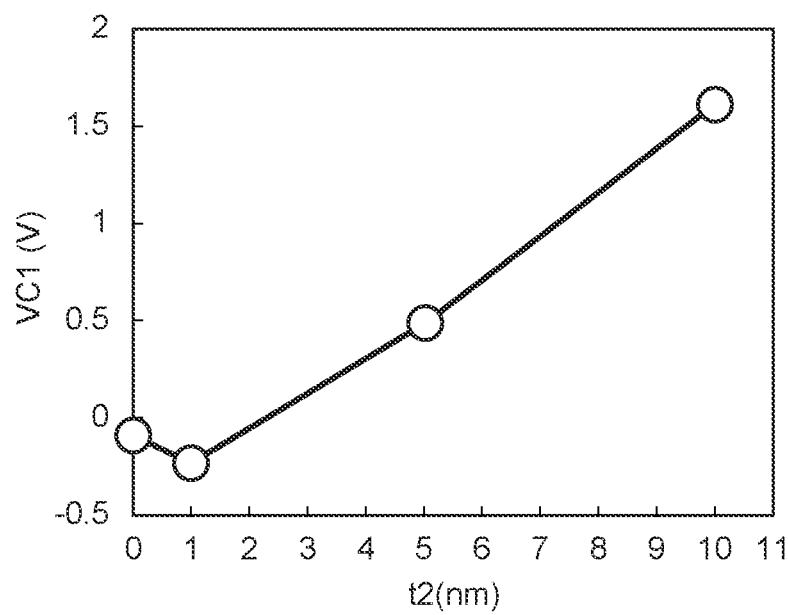
FIGS. 3A and 3B are graph views illustrating characteristics of the semiconductor device.
Figure 3B:
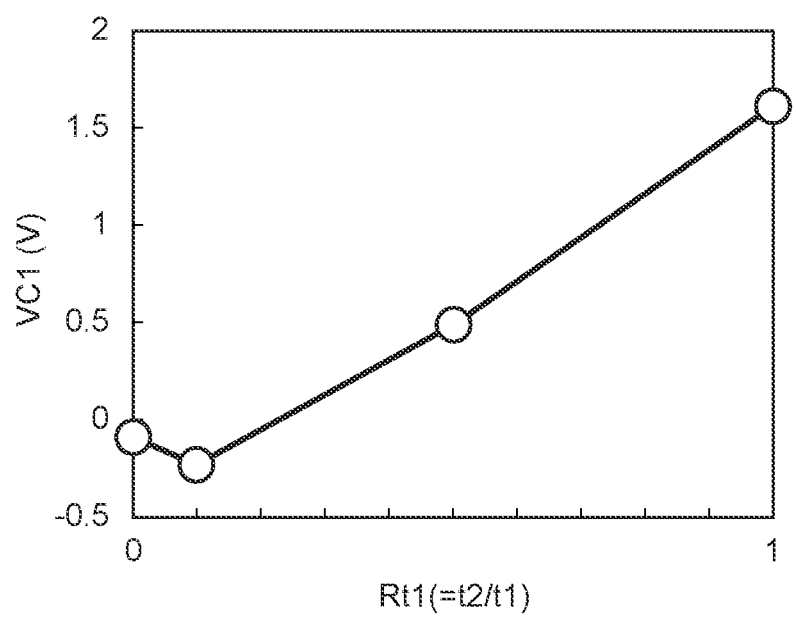

FIGS. 3A and 3B are graph views illustrating characteristics of the semiconductor device.

The horizontal axis of FIG. 3A is the second thickness t2. The horizontal axis of FIG. 3B is a thickness ratio Rt1. The thickness ratio Rt1 is a ratio of the second thickness t2 to the first thickness t1 (that is, t2/t1). The vertical axis of these figures is the fluctuation amount VC1 of the threshold voltage when a voltage stress is applied to the third electrode 53. In this example, as a voltage stress, a voltage of +15V is applied to the third electrode 53 for a period of 1000 seconds. The fluctuation amount VC1 is the difference between the threshold voltage before the voltage stress is applied and the threshold voltage after the voltage stress is applied. The measurement temperature is 150° C. In these figures, the condition that the second thickness t2 is 0 corresponds to the case where the second insulating region 42b is not provided.

As shown in FIG. 3A, when the second thickness t2 is larger than 0, the fluctuation amount VC1 becomes larger when the second thickness t2 is larger. The second thickness t2 is preferably not more than 5 nm, for example. The second thickness t2 may be, for example, not more than 3.5 nm. The fluctuation amount VC1 can be reduced.

As shown in FIG. 3B, the higher the thickness ratio Rt1, the larger the fluctuation amount VC1. The thickness ratio Rt1 is preferably not more than 0.5, for example. The thickness ratio Rt1 may be, for example, not more than 0.3. The fluctuation amount VC1 can be reduced.

Figure 4:
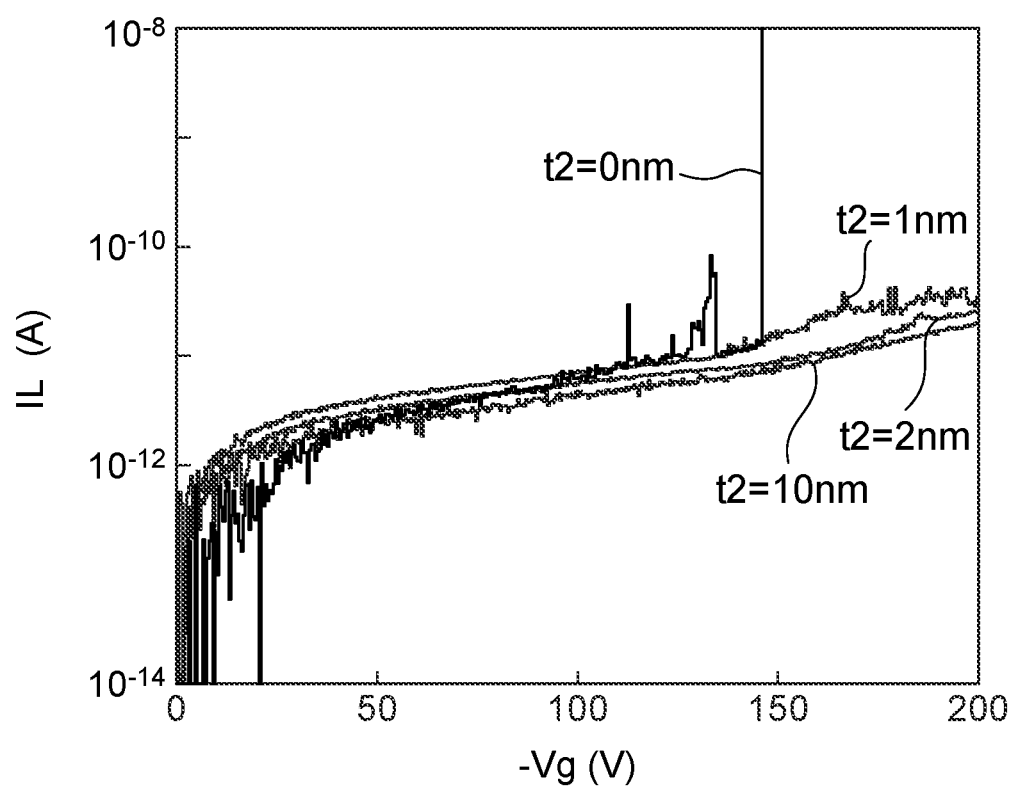
FIG. 4 is a graph view illustrating characteristics of the semiconductor device.

FIG. 4 is a graph view illustrating characteristics of the semiconductor device.

FIG. 4 illustrates the characteristics when a negative voltage is applied to the third electrode 53. The horizontal axis of FIG. 4 is a negative voltage −Vg applied to the third electrode 53. The vertical axis is a leak current IL between the third electrode 53 and the second electrode 52. In this measurement, the potential of the first electrode 51 is the same as the potential of the second electrode 52. FIG. 4 illustrates the characteristics when the second thickness t2 is changed. The condition that the second thickness t2 is 0 corresponds to the case where the second insulating region 42b is not provided.

As shown in FIG. 4, when the second thickness t2 is 0 and the second insulating region 42b is not provided, the leak current IL increases rapidly when the absolute value of the negative voltage −Vg is about 145V. The rapid increase in leak current IL corresponds to the destruction of semiconductor devices. In the embodiment, the second thickness t2 is preferably larger than 0 nm. For example, the second thickness t2 is preferably not less than 0.5 nm. For example, the second thickness t2 may be not less than 1 nm.

Figure 5:
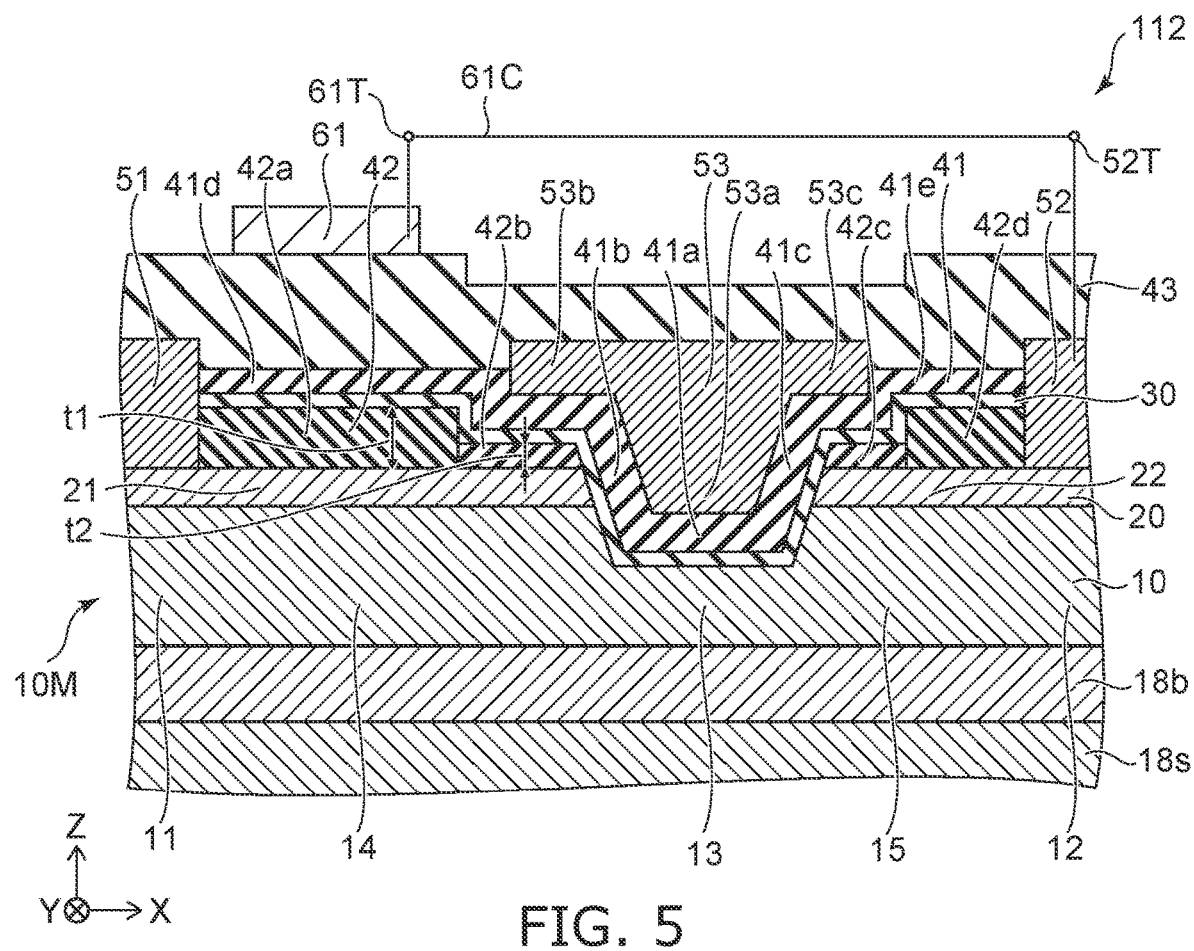
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, a semiconductor device 112 according to the embodiment includes a first conductive member 61 and a third insulating member 43 in addition to the first electrode 51, the second electrode 52, the third electrode 53, the first semiconductor region 10, the second semiconductor region 20, the first insulating member 41, and the second insulating member 42. Other configurations in the semiconductor device 112 may be the same as those in the semiconductor device 111.

In the semiconductor device 112, at least a portion of the first insulating region 42a is between the first semiconductor portion 21 and the first conductive member 61.

The first conductive member 61 is electrically connected to either the second electrode 52 or the third electrode 53. Alternatively, it is possible to be electrically connected to either the second electrode 52 or the third electrode 53. For example, the first conductive member 61 is electrically connected to, for example, either the second electrode 52 or the third electrode 53 by the connecting member 61C. In the example of FIG. 5, the first conductive member 61 is electrically connected to the second electrode 52 by the connecting member 61C. The connecting member 61C may be provided at a position different from the cross section shown in FIG. 5. For example, a terminal 61T electrically connected to the first conductive member 61 may be provided. For example, a terminal 52T electrically connected to the second electrode 52 may be provided. These terminals may be electrically connected by the connecting member 61C.

For example, the first conductive member 61 can function as a field plate. For example, the concentration of the electric field can be suppressed. For example, a high breakdown voltage can be obtained. For example, current collapse can be suppressed.

For example, an electric capacity is formed between the first conductive member 61 and the carrier region. Since the first insulating region 42a is thick, the distance between the first conductive member 61 and the carrier region becomes long. Since the first insulating region 42a is thick, the electric capacity can be reduced. Parasitic capacitance can be reduced. For example, good switching characteristics can be easily obtained. For example, switching loss can be reduced.

Figure 6:
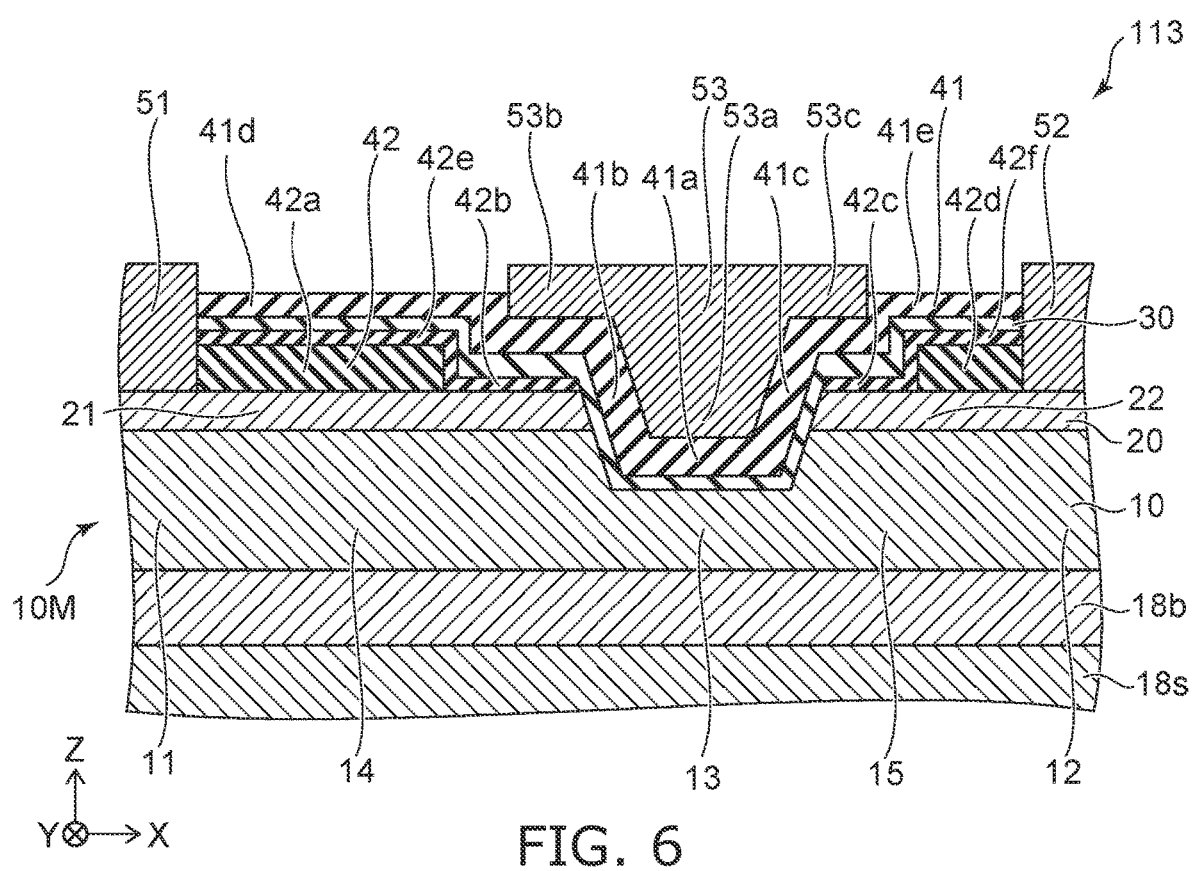
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, a semiconductor device 113 according to the embodiment also includes the first electrode 51, the second electrode 52, the third electrode 53, the first semiconductor region 10, the second semiconductor region 20, the first insulating member 41, and the second insulating member 42. In the semiconductor device 113, the second insulating member 42 includes a fifth insulating region 42e and a sixth insulating region 42f. Other configurations in the semiconductor device 113 may be the same as those in the semiconductor device 111 (or the semiconductor device 110).

The first insulating region 42a is between the first semiconductor portion 21 and the fifth insulating region 42e. The fifth insulating region 42e has at least one of a fifth nitrogen concentration higher than the first nitrogen concentration, a fifth hydrogen concentration lower than the first hydrogen concentration, or a fifth density higher than the first density. A material of the fifth insulating region 42e may be the same as the material of the second insulating region 42b, for example. The fifth insulating region 42e may be continuous with the second insulating region 42b.

The fourth insulating region 42d is between the second semiconductor portion 22 and the sixth insulating region 42f. The sixth insulating region 42f has at least one of a sixth nitrogen concentration lower than the third nitrogen concentration, a sixth hydrogen concentration higher than the third hydrogen concentration, or a sixth density lower than the third density. A material of the sixth insulating region 42f may be the same as the material of the third insulating region 42c, for example. The sixth insulating region 42f may be continuous with the third insulating region 42c.

A high breakdown voltage can also be obtained in the semiconductor devices 111 to 113. A stable threshold voltage can be obtained. Current collapse can be suppressed. The characteristics can be improved.

Figure 7:
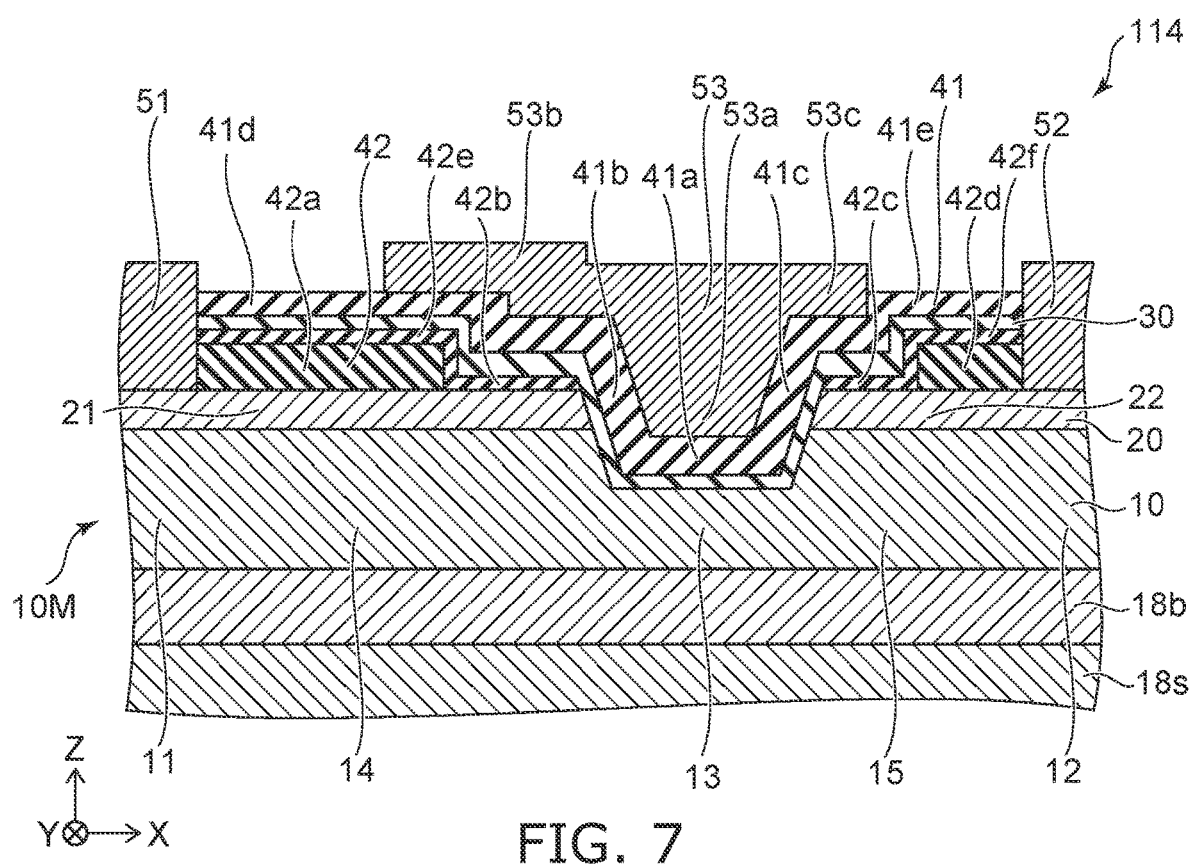
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, a semiconductor device 114 according to the embodiment also includes the first electrode 51, the second electrode 52, the third electrode 53, the first semiconductor region 10, the second semiconductor region 20, the first insulating member 41, and the second insulating member 42. In the semiconductor device 114, a shape of the third electrode 53 is different from a shape of the third electrode 53 in the semiconductor device 112. Other configurations in the semiconductor device 114 may be the same as those in the semiconductor device 113.

As shown in FIG. 7, the third electrode 53 includes the second electrode portion 53b. A portion of the first semiconductor portion 21 is between the fourth portion region 14 and the second electrode portion 53b. At least a portion of the first insulating region 42a is between a portion of the first semiconductor portion 21 and the second electrode portion 53b. At least a portion of the second insulating region 42b is between another portion of the first semiconductor portion 21 and the second electrode portion 53b.

In the semiconductor device 114, the first insulating region 42a overlaps the second electrode portion 53b in the Z-axis direction. For example, the gate-drain capacity can be reduced. For example, the second electrode portion 53b can function as a gate field plate. For example, it becomes easy to obtain a high breakdown voltage.

Figure 8:
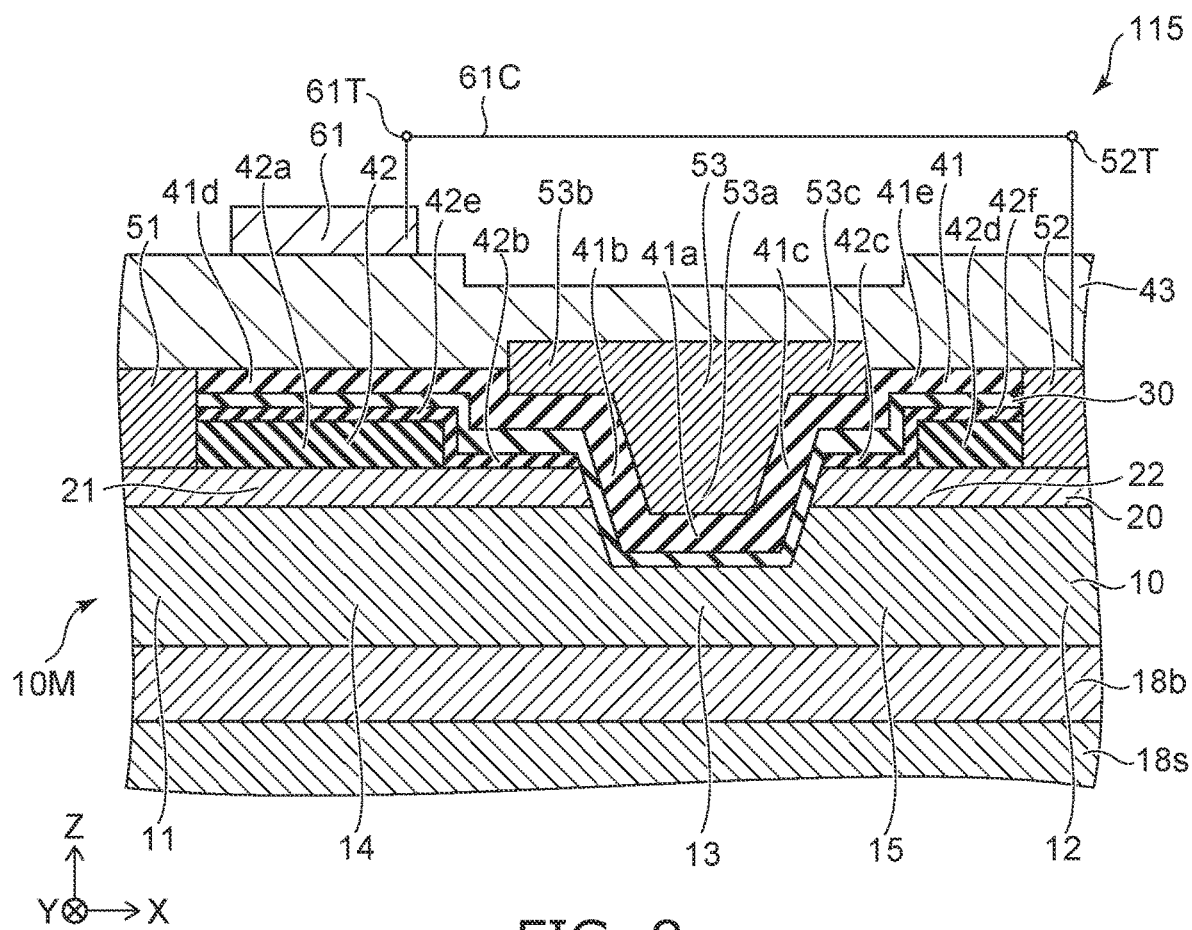
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in a semiconductor device 115 according to the embodiment, the first conductive member 61 is provided. Other configurations in the semiconductor device 115 may be the same as those in the semiconductor device 113 (or the semiconductor device 114). For example, concentration of the electric field can be suppressed. For example, a high breakdown voltage can be obtained.

Figure 9:
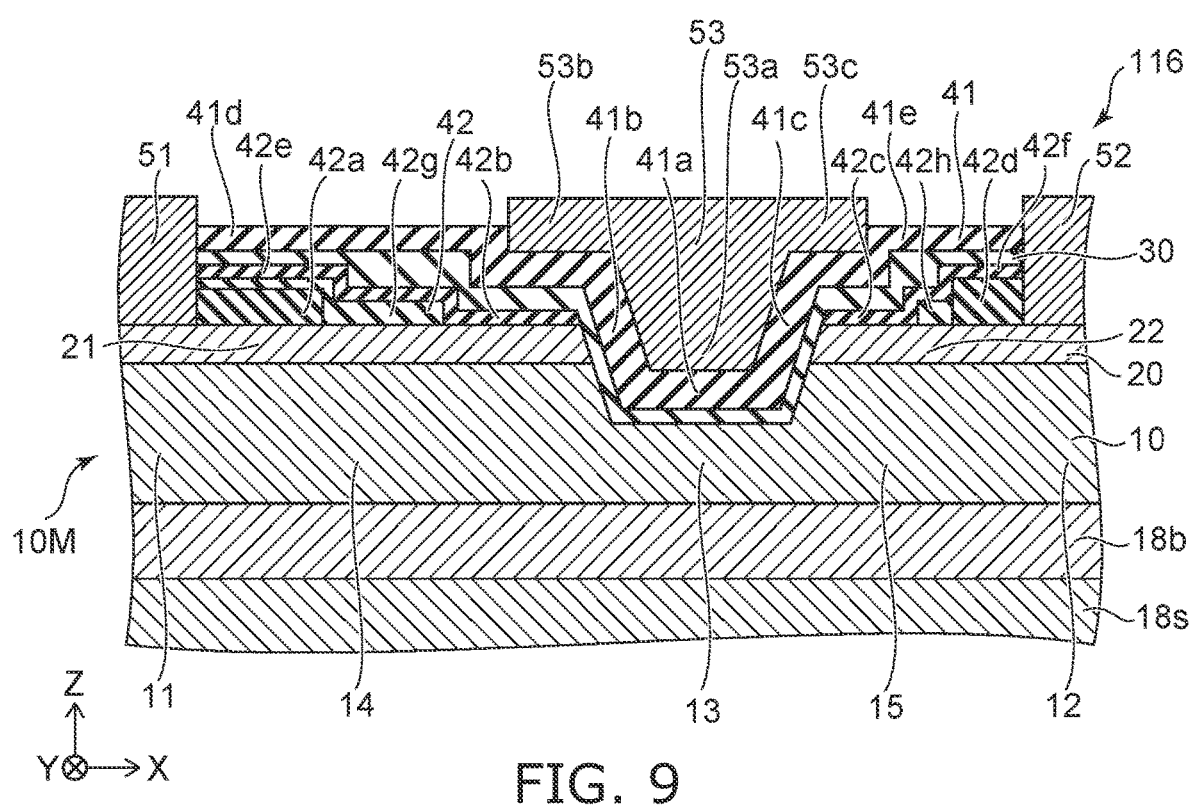
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, a semiconductor device 116 according to the embodiment also includes the first electrode 51, the second electrode 52, the third electrode 53, the first semiconductor region 10, the second semiconductor region 20, the first insulating member 41, and the second insulating member 42. In the semiconductor device 116, the configuration of the second insulating member 42 is different from the configuration of the second insulating member 42 in the semiconductor device 113. Other configurations in the semiconductor device 116 may be the same as those in the semiconductor device 113.

As shown in FIG. 9, the second insulating member 42 includes a seventh insulating region 42g. At least a portion of the seventh insulating region 42g is between the first insulating region 42a and the second insulating region 42b in the first direction (X-axis direction).

The seventh insulating region 42g includes at least one of a seventh nitrogen concentration between the first nitrogen concentration and the second nitrogen concentration, a seventh hydrogen concentration between the first hydrogen concentration and the second hydrogen concentration, or a seventh density between the first density and the second density.

As shown in FIG. 9, the second insulating member 42 may include an eighth insulating region 42h. At least a portion of the eighth insulating region 42h is between the third insulating region 42c and the fourth insulating region 42d in the first direction (X-axis direction).

The eighth insulating region 42h includes at least one of an eighth nitrogen concentration between the third nitrogen concentration and the fourth nitrogen concentration, an eighth hydrogen concentration between the third hydrogen concentration and the fourth hydrogen concentration, or an eighth density between the third density and the fourth density.

As described above, the second insulating member 42 may include an intermediate region (seventh insulating region 42g and eighth insulating region 42h). The number of intermediate regions is arbitrary. For example, the boundary between the multiple insulating regions in the second insulating member 42 may be clear or unclear.

A high breakdown voltage can also be obtained in the semiconductor devices 114 to 116. A stable threshold voltage can be obtained. Current collapse can be suppressed. The characteristics can be improved.

When the second thickness t2 is thinner than the first thickness t1, such as the semiconductor device 111 or the semiconductor device 112, the characteristics (composition ratio, density, etc.) of the second insulating region 42b may be substantially the same as the characteristics (composition ratio or density, etc.) of the first insulating region 42a. Due to the difference in thickness, it is easy to obtain a stable threshold voltage.

Second Embodiment

The second embodiment relates to a method for manufacturing a semiconductor device.

FIGS. 10A to 10D, and FIGS. 11A to 11D are schematic cross-sectional views illustrating a method for manufacturing a semiconductor device according to the second embodiment.

Figure 10A:
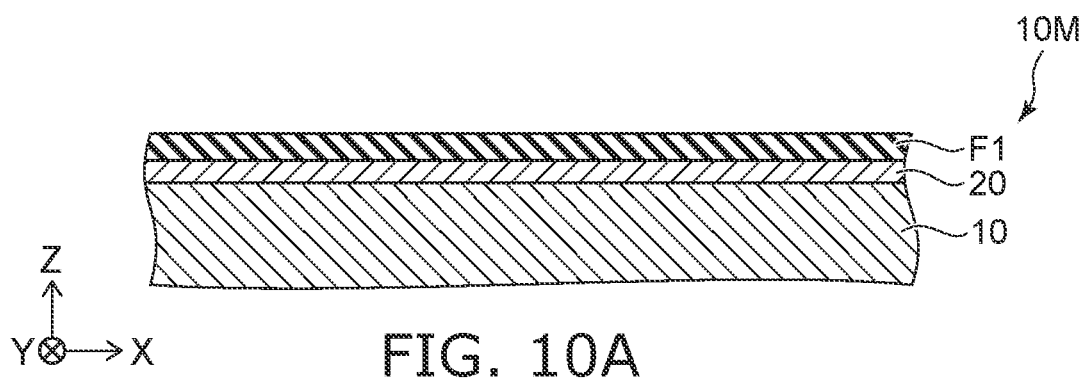
FIGS. 10A to 10D are schematic cross-sectional views illustrating a method for manufacturing a semiconductor device according to a second embodiment.

As shown in FIG. 10A, the semiconductor member 10M is prepared. The semiconductor member 10M includes the first semiconductor region 10 including $Al_{x1}Ga_{1-x1}N$ (0≤x1<1) and the second semiconductor region 20 including $Al_{x2}Ga_{1-x2}N$ (x1<x2≤1) provided on the first semiconductor region 10.

As shown in FIG. 10A, a first insulating film F1 is formed on the second semiconductor region 20. The first insulating film F1 includes at least one of silicon or aluminum, and oxygen.

Figure 10B:
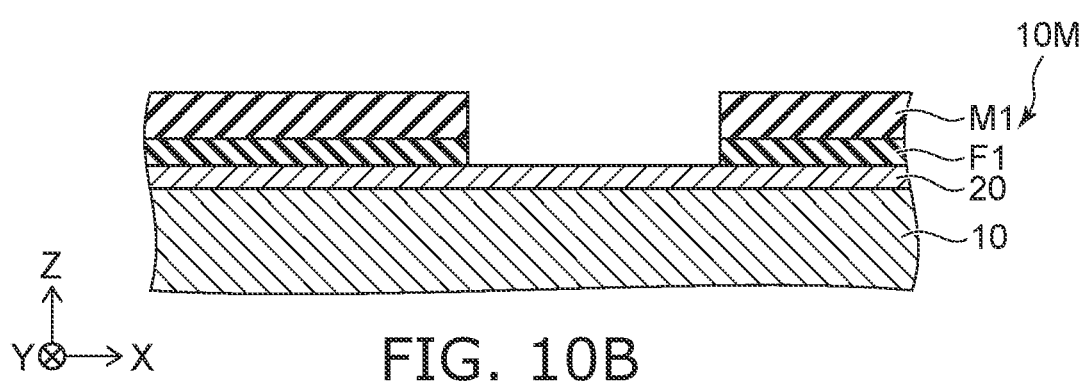

As shown in FIG. 10B, a mask material M1 is formed on the first insulating film F1, and a portion of the first insulating film F1 is removed by using the mask material M1 as a mask. The removal is performed, for example, by performing wet etching.

In this way, the first insulating film F1 including silicon and nitrogen is formed on a portion of the second semiconductor region 20 of the semiconductor member 10M.

Figure 10C:
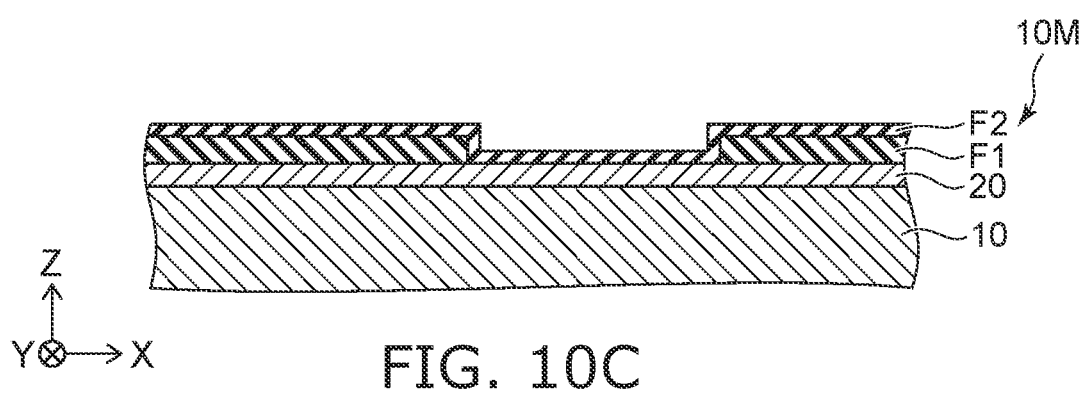

As shown in FIG. 10C, a second insulating film F2 including silicon and nitrogen is formed on the other portion of the second semiconductor region 20. The second insulating film F2 including silicon and nitrogen may be formed on the other portion of the second semiconductor region 20, and the first insulating film F1.

Figure 10D:
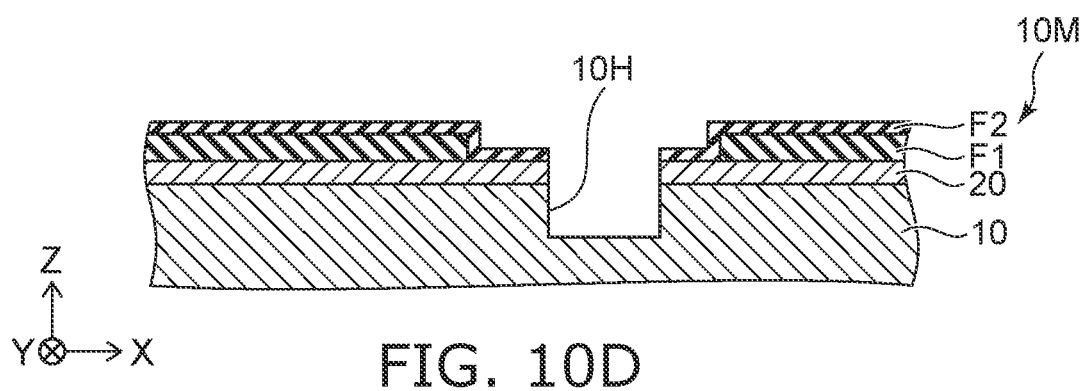

As shown in FIG. 10D, a portion of the second insulating film F2 is removed, and a hole 10H is formed in the semiconductor member 10M exposed by removing a portion of the second insulating film F2. The hole 10H reaches the first semiconductor region 10.

Figure 11A:
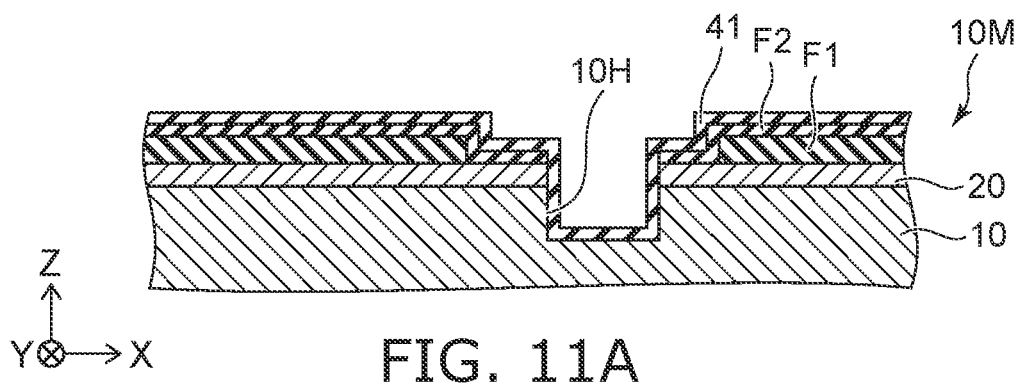
FIGS. 11A to 11D are schematic cross-sectional views illustrating a method for manufacturing a semiconductor device according to a second embodiment.

As shown in FIG. 11A, a first insulating member 41 including at least one of silicon or aluminum, and oxygen is formed in the hole 10H. If necessary, a film to be the nitride member 30 may be formed before the formation of the first insulating member 41.

Figure 11B:
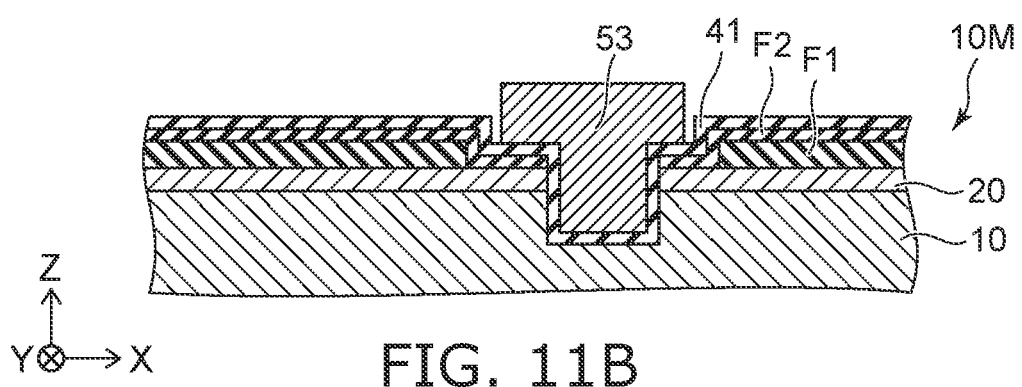

As shown in FIG. 11B, the third electrode 53 is formed in the remaining space of the hole 10H.

Figure 11C:
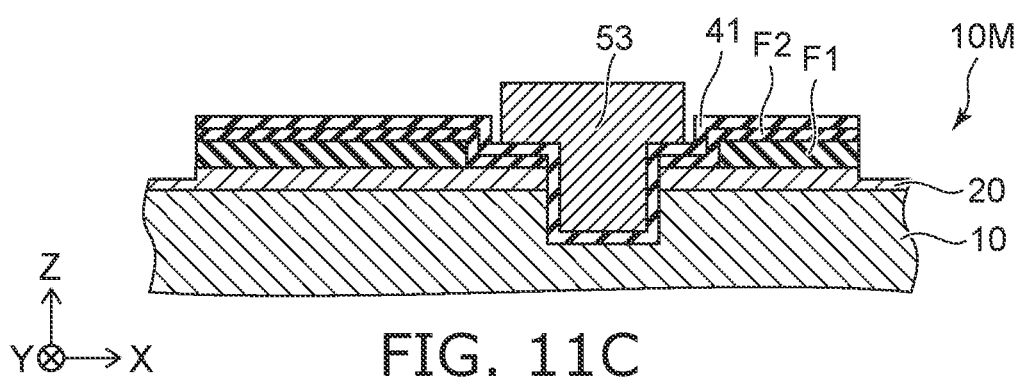

As shown in FIG. 11C, a portion of the first insulating film F1 and a portion of the second insulating film F2 are removed.

Figure 11D:
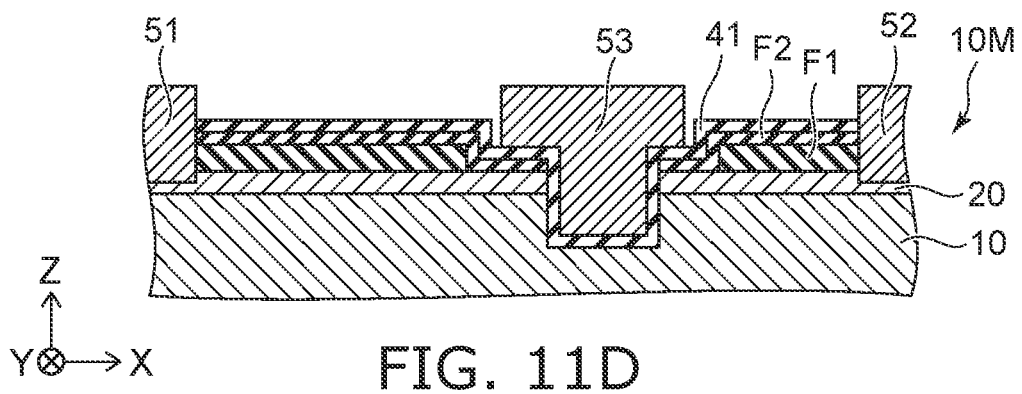

As shown in FIG. 11D, the first electrode 51 and the second electrode 52 are formed. There are the first insulating film F1 and the second insulating film F2 between the first electrode 51 and the third electrode 53, and between the second electrode 52 and the third electrode 53.

The second insulating film F2 has at least one of the second nitrogen concentration higher than the first nitrogen concentration in the first insulating film F1, the second hydrogen concentration lower than the first hydrogen concentration in the first insulating film F1, or the second density higher than the first density in the first insulating film F1. For example, the first insulating film F1 provides the first insulating region 42a and the fourth insulating region 42d. For example, the second insulating film F2 provides the second insulating region 42b and the third insulating region 42c.

According to the manufacturing method according to the embodiment, a semiconductor device which is possible to improve characteristics can be obtained.

The first electrode 51 includes, for example, at least one selected from the group consisting of aluminum, titanium, nickel, and gold. The second electrode 52 includes, for example, at least one selected from the group consisting of aluminum, titanium, nickel, and gold. The third electrode 53 includes, for example, at least one selected from the group consisting of TiN, WN, Ni, Au, Pt and Ti. The first conductive member 61 includes, for example, a metal. The metal included in the first conductive member 61 includes, for example, at least one selected from the group consisting of aluminum, copper, and gold. The third electrode 53 and the first conductive member 61 may include, for example, conductive silicon or polysilicon or the like.

According to the embodiment, a semiconductor device and a method for manufacturing the same can be provided, in which characteristics are possible to be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward the second electrode being along a first direction;
a third electrode including a first electrode portion, a position of the first electrode portion in the first direction being between a position of the first electrode in the first direction and a position of the second electrode in the first direction;
a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a direction from the first partial region toward the first electrode being along a second direction crossing the first direction, a direction from the second partial region toward the second electrode being along the second direction, a direction from the third partial region toward the first electrode portion being along the second direction, the fourth partial region being between the first partial region and the third partial region in the first direction, the fifth partial region being between the third partial region and the second partial region in the first direction;
a second semiconductor region including $Al_{x2}Ga_{1-x2}2N$ ($x1 < x2 \leq 1$), the second semiconductor region including a first semiconductor portion and a second semiconductor portion, a direction from the fourth partial region toward the first semiconductor portion being along the second direction, a direction from the fifth partial region toward the second semiconductor portion being along the second direction;
a first insulating member including oxygen and at least one of silicon or aluminum, the first insulating member including a first insulating portion, the first insulating portion being between the third partial region and the first electrode portion; and
a second insulating member including silicon and nitrogen, the second insulating member including a first insulating region and a second insulating region, a position of the first insulating region in the first direction being between the position of the first electrode in the first direction and the position of the first electrode portion in the first direction, a position of the second insulating region in the first direction being between the position of the first insulating region in the first direction and the position of the first electrode portion in the first direction, the first semiconductor portion being between the fourth partial region and the first insulating region, and between the fourth partial region and the second insulating region, the second insulating region having at least one of a second nitrogen concentration higher than a first nitrogen concentration in the first insulating region, a second hydrogen concentration lower than a first hydrogen concentration in the first insulating region, or a second density higher than a first density in the first insulating region.

2. The device according to claim 1, wherein
the second insulating member includes a third insulating region and a fourth insulating region,
a position of the third insulating region in the first direction is between the position of the first electrode portion in the first direction and the position of the second electrode in the first direction,
a position of the fourth insulating region in the first direction is between the position of the third insulating region in the first direction and the position of the second electrode in the first direction,
the second semiconductor portion is between the fifth partial region and the third insulating region, and between the fifth partial region and the fourth insulating region, and
the third insulating region has at least one of a third nitrogen concentration higher than a fourth nitrogen concentration in the fourth insulating region, a third hydrogen concentration lower than a fourth hydrogen concentration in the fourth insulating region, or a third density higher than a fourth density in the fourth insulating region.

3. The device according to claim 2, wherein
a ratio of a concentration of silicon to a concentration of nitrogen in the third insulating region is lower than 0.75.

4. The device according to claim 2, wherein
a ratio of a concentration of silicon to a concentration of nitrogen in the fourth insulating region is higher than 0.75.

5. The device according to claim 2, wherein
a third thickness of the third insulating region along the second direction is thinner than a fourth thickness of the fourth insulating region in the second direction.

6. The device according to claim 2, wherein
the third electrode further includes a third electrode portion,
a portion of the second semiconductor portion is between the fifth partial region and the third electrode portion, and
at least a portion of the third insulating region is between the portion of the second semiconductor portion and the third electrode portion.

7. The device according to claim 2, wherein
the second insulating member further includes a sixth insulating region,
the fourth insulating region is between the second semiconductor portion and the sixth insulating region, and
the sixth insulating region has at least one of a sixth nitrogen concentration lower than the third nitrogen concentration, a sixth hydrogen concentration higher than the third hydrogen concentration, or a sixth density lower than the third density.

8. The device according to claim 1, wherein
a ratio of a concentration of silicon to a concentration of nitrogen in the second insulating region is lower than 0.75.

9. The device according to claim 1, wherein
a ratio of a concentration of silicon to a concentration of nitrogen in the first insulating region is higher than 0.75.

10. The device according to claim 1, wherein
a second thickness of the second insulating region along the second direction is thinner than a first thickness of the first insulating region in the second direction.

11. The device according to claim 10, wherein
a ratio of the second thickness to the first thickness is not more than 0.5.

12. The device according to claim 10, further comprising:
a first conductive member; and
a third insulating member,
at least a portion of the first insulating region being between the first semiconductor portion and the first conductive member,
at least a portion of the third insulating member being between at least a portion of the first insulating member and the first conductive member, and
the first conductive member being electrically connected to one of the second electrode or the third electrode, alternatively being configured to be electrically connected to the one of the second electrode or the third electrode.

13. The device according to claim 1, wherein
the second insulating member further includes a fifth insulating region,
the first insulating region is between the first semiconductor portion and the fifth insulating region, and
the fifth insulating region has at least one of a fifth nitrogen concentration higher than the first nitrogen concentration, a fifth hydrogen concentration lower than the first hydrogen concentration, or a fifth density higher than the first density.

14. The device according to claim 1, wherein
the third electrode further includes a second electrode portion,
a portion of the first semiconductor portion is between the fourth partial region and the second electrode portion, and
at least a portion of the second insulating region is between the portion of the first semiconductor portion and the second electrode portion.

15. The device according to claim 14, wherein
at least a portion of the first insulating region is between the portion of the first semiconductor portion and the second electrode portion.

16. The device according to claim 1, wherein
the second insulating member further includes a seventh insulating region,
at least a portion of the seventh insulating region is between the first insulating region and the second insulating region in the first direction, and
the seventh insulating region has at least one of a seventh nitrogen concentration between the first nitrogen concentration and the second nitrogen concentration, a seventh hydrogen concentration between the first hydrogen concentration and the second hydrogen concentration, or a seventh density between the first density and the second density.

17. The device according to claim 1, further comprising:
a nitride member including Al$_{x3}$Ga$_{1-x3}$N ($x2<x3\leq1$),
at least a portion of the nitride member being between the third partial region and the first insulating portion.

18. The device according to claim 1, wherein
at least a portion of the first electrode portion is between the first semiconductor portion and the second semiconductor portion in the first direction.

* * * * *